United States Patent [19]

Tomita et al.

[11] Patent Number: 5,004,945
[45] Date of Patent: Apr. 2, 1991

[54] PIEZOELECTRIC TYPE ACTUATOR

[75] Inventors: Masahiro Tomita, Anjo; Satoshi Hayashi, Kuwana; Shinro Oda, Kuwana; Akira Fujii, Kuwana; Masayoshi Tanigawa, Kariya, all of Japan

[73] Assignee: Nippondenso Co., Ltd., Kariya, Japan

[21] Appl. No.: 410,525

[22] Filed: Sep. 22, 1989

[30] Foreign Application Priority Data

Sep. 26, 1988 [JP] Japan ................. 63-239949

[51] Int. Cl.⁵ .......................................... H01L 41/08
[52] U.S. Cl. ..................... 310/328; 123/498
[58] Field of Search ............ 310/323, 328, 366, 338, 310/329; 123/498

[56] References Cited

U.S. PATENT DOCUMENTS

| | | | |
|---|---|---|---|
| 3,474,403 | 10/1969 | Massa et al. | 310/329 X |
| 3,482,121 | 12/1969 | Hatschek | 310/329 |
| 4,225,802 | 9/1980 | Suzuki et al. | 310/329 X |
| 4,438,363 | 3/1984 | Babitzka et al. | 310/328 X |
| 4,460,842 | 7/1984 | Waanders et al. | 310/328 X |
| 4,781,477 | 11/1988 | Nagasawa | 310/328 X |
| 4,783,610 | 11/1988 | Asano | 310/328 |

FOREIGN PATENT DOCUMENTS

| | | |
|---|---|---|
| 57-4434 | 1/1982 | Japan. |
| 58-218183 | 12/1983 | Japan. |
| 59-10178 | 1/1984 | Japan. |
| 62-150067 | 7/1987 | Japan. |

Primary Examiner—Mark O. Budd
Attorney, Agent, or Firm—Cushman, Darby & Cushman

[57] ABSTRACT

According to the present invention there is provided a piezoelectric type actuator wherein a compressive force is exerted on a piezoelectric laminate, using a coil spring having a relatively small spring constant and a coned disc spring having a relatively large spring constant, the said compressive force being in the range of 4.0 to 50 in terms of the ratio of the spring constant of the coned disc spring to that of the coil spring.

Under the above construction, the performance of the piezoelectric laminate is not deteriorated under any conditions during use, and the size of the piezoelectric type actuator can be reduced.

14 Claims, 7 Drawing Sheets

PIEZOELECTRIC TYPE ACTUATOR

FIELD OF THE INVENTION

The present invention relates to a piezoelectric type actuator constituted by a laminate of a large number of piezoelectric plates as piezoelectric elements which expand and contract according to voltages applied. For example, the present invention is applied to an actuator for driving a fuel injection device.

BACKGROUND OF THE INVENTION

In a fuel injection device of a Diesel engine, an actuator is connected to a fuel passage which connects a fuel injection pump with an injection nozzle, or to a fuel injection pumping chamber, to control the fuel pressure. A piezoelectric laminate used in this actuator is advantageous in that its response characteristic is good and that it affords a large driving force.

In general, a piezoelectric laminate is used in a preset load-applied state in order to attain the improvement of performance and reliability. It is known, for example, in Japanese Patent Laid-Open Nos. 10178/84 and 150067/87 that a coned disc spring, a coil spring, or a bolt, is used as a unitary member for the application of the said preset load.

In the structures of known piezoelectric laminates, however, many hours of use may result in a shortening of the overall length in the laminated direction due to compatibility of the constituent piezoelectric elements or due to domain inversion. If in view of this point there is used a piezoelectric type actuator wherein a preset load is applied to a piezoelectric laminate by means of a coned disc spring having a large spring constant or by virtue of a tightening force of a bolt, since the effective tightening stroke of the bolt which fulfills the spring action is small, there arise problems, for example, the preset load is apt to decrease and the performance of the piezoelectric elements is deteriorated, or in the extreme case the preset load is extinguished, causing damage to the piezoelectric elements.

Conversely, according to a piezoelectric type actuator wherein a preset load is applied using a spring having a small spring constant and a large effective stroke, e.g. a coil spring, it becomes necessary to thicken the coil spring in diameter for the application of a predetermined preset load (0.5–5 kg/mm$^2$), so there arises the problem that the size of the piezoelectric actuator becomes larger.

The present invention has been accomplished in order to solve such problems, and it is the object thereof to provide a piezoelectric type actuator wherein a predetermined preset load is applied in an initial state and which permits the application of a minimum preset load required under any environmental conditions during use and can be reduced in size.

SUMMARY DESCRIPTION OF THE INVENTION

In one aspect, for achieving the above-mentioned object, the piezoelectric type actuator of the present invention is characterized by comprising a piezoelectric laminate comprising alternately super-imposed piezoelectric plates as piezoelectric elements and metallic electrode plates; a first spring means for exerting a compressive force on the piezoelectric laminates, the first spring means having a relatively small spring constant; and a second spring means for exerting a compressive force on the piezoelectric laminate, the second spring means having a relatively large spring constant.

It is preferable that the ratio of the spring constant of the second spring means to that of the first spring means be in the range of 4.0 to 50.

In another aspect the piezoelectric type actuator of the present invention comprises a piezoelectric laminate comprising alternately superimposed piezoelectric plates as piezoelectric elements and metallic electrode plates; a first spring means for exerting a compressive force on the piezoelectric laminate; and a second spring for exerting a compressive force on the piezoelectric laminate. The ratio of the spring load of the first spring means to that of the second spring means is in the range of ¼ to 4.

In a further aspect the piezoelectric type actuator of the present invention comprises a piston which comprises a piezoelectric laminate comprising alternately superimposed piezoelectric plates as piezoelectric elements and metallic electrode plates, and a holder member receiving therein the piezoelectric laminate slidably and having a bottomed portion formed at one end thereof and a flange formed at an opening portion of the other end thereof; a first body which receives therein at least the flange-side end face of the piston slidably; a second body having a shoulder portion opposed to the flange of the holder member; a first spring means for exerting a compressive force on the piezoelectric laminate, the first spring means being interposed between the shoulder portion of the second body and the flange of the holder member and having a relatively small spring constant; and a second spring means for exerting a compressive force on the piezoelectric laminate, the second spring means being interposed between the second body and the bottomed portion of the holder member and having a relatively large spring constant.

According to the piezoelectric actuator of the present invention, when the piezoelectric actuator is operated over long hours and the overall length of thereof is slightly shortened due to compatibility of the constituent piezoelectric elements or domain inversion, there sometimes occurs the case where a preset load is not applied by the second spring means having a relatively large spring constant. In this case, the performance of the piezoelectric laminate is not greatly deteriorated because a minimum preset load required is ensured by the first spring means having a relatively small spring constant.

Further, since a set load of a predetermined value or larger is ensured at all times by the first spring means having a relatively small spring constant, the piezoelectric laminate is not wobbled by external vibrations or vibrations in driving, so the piezoelectric laminate is not likely to be damaged.

According to the piezoelectric type actuator of the present invention, as set forth above, since there are adopted certain specific spring means for applying a preset load to a piezoelectric laminate comprising alternately superimposed piezoelectric plates and electrode plates, a predetermined preset load can be exerted on the piezoelectric laminate in an initial state. Moreover, since a minimum set load required can be applied under any conditions during use, the size of the piezoelectric actuator can be reduced without deterioration of the performance of the piezoelectric laminate. Further, the damage of the piezoelectric laminate caused by wobbling due to external vibrations can be surely prevented.

DETAILED DESCRIPTION OF THE PREFERRED EMBODIMENTS

Embodiments of the present invention will be described hereinunder with reference to the accompanying drawings.

Figure 1:
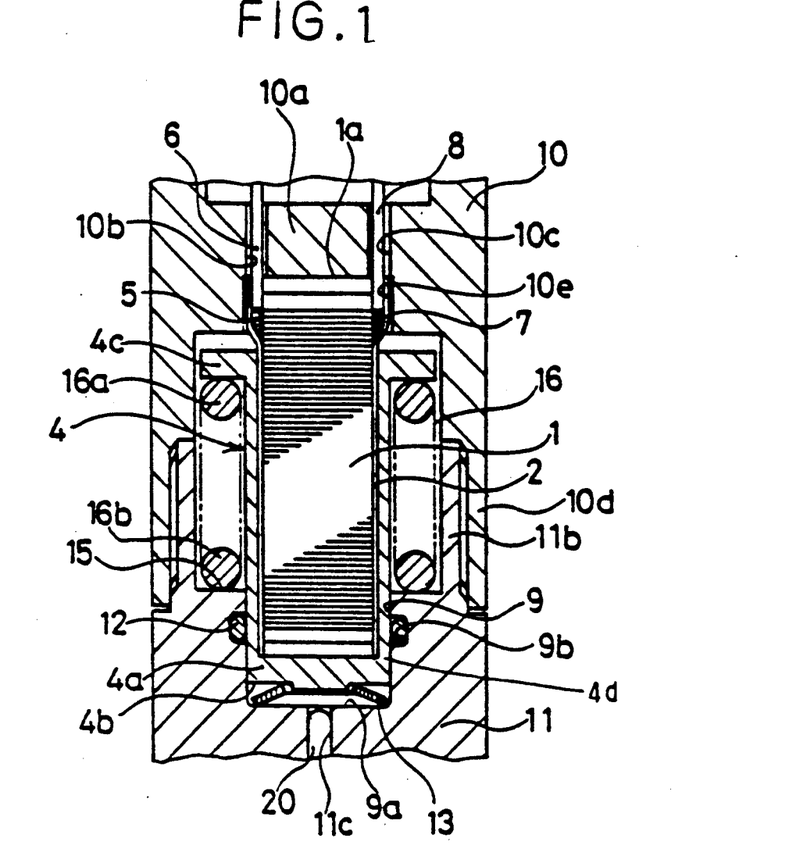
FIG. 1 is a schematic sectional view of a piezoelectric type actuator according to a first embodiment of the present invention.

In FIG. 1, which illustrates a first embodiment of the present invention, a piezoelectric laminate 1 comprises alternately laminated piezoelectric plates as piezoelectric elements each in the form of a disc and metallic electrode plates. The electrode plates located alternately are electrically connected with one another and a positive electrode is connected to this electrode plate group, while the other alternately located electrode plates are also connected with one another and a negative electrode is connected to this second electrode plate group. When voltage is applied between the first and the second electrode plate group, the piezoelectric plates extend due to an inverse piezoelectric effect of the piezoelectric elements, so that the piezoelectric laminate 1 composed of the piezoelectric plates and the electrode plates extend in the laminated direction. Upon release of the applied voltage, the piezoelectric laminate 1 reverts to its original length. The piezoelectric laminate 1, which is cylindrical, is inserted into an insulating tube 2, whereby it is insulated from the exterior.

At the outer periphery of the upper end of the piezoelectric laminate 1 there are formed leads take-out portions 5 and 7, to which are connected lead wires 6 and 8, respectively. The lead wires 6 and 8 extend to the exterior through lead take-out holes 10b and 10c formed in a bottom portion 10a of a first body 10.

The piezoelectric laminate 1 received in the insulating tube 2 is further received in this state in a cylindrical, bottomed piston 4. A bottomed portion 4a of the piston 4 and an outer peripheral portion of the piston adjacent thereto are slidably fitted in a circular, concave cylinder portion 9 formed in a second body 11. An O-ring 12 is fitted in a concave groove 9b formed in the inner peripheral wall surface of the cylinder portion 9 to seal a space which is in contact with a cylinder bottom 9a. A coned disc spring 13 having a relatively large spring constant is disposed in the portion defined by both the cylinder bottom 9a and an end face 4b of the piston 4.

An annular arm portion 11b of the second body is fixed with a screw to the inner peripheral side of an annular arm portion 10d of the first body 10. On the inner periphery side of the annular arm portion 11b, the piston 4 which holds therein the piezoelectric laminate 1 through a holder member 4d is slidably received in the cylinder portion 9. A guide hole 11c is formed in the second body, in which is slidably received a plunger 20. With descent of the piston 4, the plunger 20 is moved downwards through oil which is sealed in the portion defined by both the cylinder bottom 9a and the end face 4b of the piston 4.

A flange 4c is formed at an opening portion on the side opposite to the bottomed portion 4a of the piston 4, and one end 16a of a coil spring 16 having a relatively small spring constant is in abutment with the flange 4c, while the other end, indicated by 16b, of the coil spring is in abutment with a shoulder portion 15 of the second body 11. The compressive force of the coil spring 16 urges the flange 4c upwards in FIG. 1, whereby a preset load is applied to the piezoelectric laminate in the piston 4.

In mounting, with the piezoelectric laminate 1 received in the piston 4, the piezoelectric laminate 1 is pushed into a concave portion 10e of the body until an end face 1a of the piezoelectric laminate 1 positioned on the side of the lead take-out portions 5 and 7 comes into contact with the bottomed portion 10a of the body 10. At this time, the lead wires 6 and 8 are taken out to the exterior from the respective lead take-out holes 10b and 10c.

Next, the coil spring 16, which has an inside diameter larger than the outside diameter of the piston 4, is loosely fitted on the outer periphery of the piston from the bottomed portion 4a side of the piston.

The coned disc spring 13 is disposed beforehand on the cylinder bottom 9a of the cylinder portion 9 of the second body 11, and the bottomed portion 4a of the piston 4 is inserted into the cylinder portion 9 from above the coned disc spring 13 in FIG. 1. Then, the annular arm portion 10d of the first body is fitted over the outer periphery of the annular arm portion 10d of the first body and fixed thereto with screw.

At this time, the coil spring 16 having a relatively small spring constant and the coned disc spring 13 having a relatively large spring constant both act in a direction to push the piston 4 against the first body 10, so that a preset load is exerted as a compressive force on the piezoelectric laminate 1 received in the piston 4.

The reason why a preset load is applied to the piezoelectric laminate 1 by means of the coil spring 16 having a relatively small spring constant is as follows. When the piezoelectric laminate 1 is used for many hours, the overall length of the piezoelectric laminate 1 is sometimes shortened as compared with that measured at the time of setting the preset load due to compatibility of the piezoelectric plates and the electrode plates or due to domain inversion, so it is intended to prevent deterioration in performance of the piezoelectric elements caused by decrease of the preset load, or prevent the piezoelectric elements themselves from being damaged by vibrations induced with decrease of the preset load.

Figure 2:
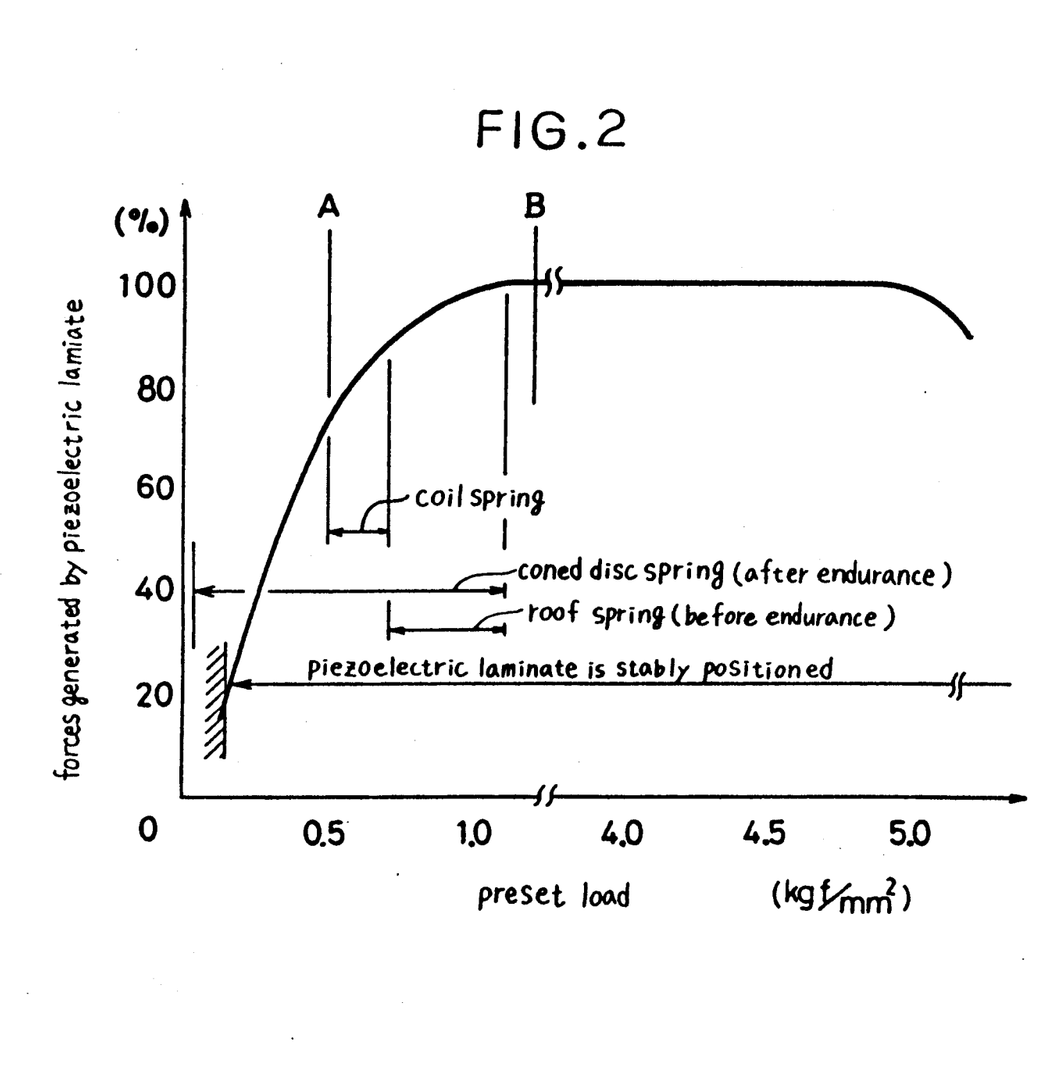
FIG. 2 is a diagram showing the relation between preset loads and generated forces of a piezoelectric laminate in the first embodiment.

FIG. 2 shows the relation between preset loads and forces generated with expansion and contraction of the piezoelectric laminate. In the graph of the same figure, the axis of abscissa represent preset loads per unit area applied to the piezoelectric laminate 1, while the axis of ordinate represents the percentage (%) of force generated by the piezoelectric laminate 1 on the basis of the force generated by the piezoelectric laminate when an optimum preset load is exerted thereon which is assumed to be 100%.

The data shown in the graph of FIG. 2 is based on the results of experiments conducted by the present inventors. In the experiments there were used the coil spring 16 as a spring with a relatively small spring constant and the coned disc spring 13 as a spring with a relatively large spring constant. The coil spring 16 and coned disc spring 13 were measured for initial set loads and set loads after endurance.

In the case of coil springs, the scatter in set load was within the range of about 15-18%, including the scatter in size of piezoelectric laminates and of peripheral components and the scatter in the coil springs themselves. There was little change between the set load at the initial stage and that after endurance. However, when only coil springs were used for the application of a preset load, there could be obtained only 70-80% of the force capable of being generated inherently by the piezoelectric laminates. Further, it was difficult to have the coil springs received in a predetermined size while maintaining an optimum preset load.

In the case of coned disc springs, adjustment was made using shim in consideration of the scatter in size of piezoelectric laminates and of peripheral components and the scatter in the coned disc springs themselves. As a result, the scatter in set load of the coned disc springs could be adjusted within the range of about 21% to 23%. It was possible to have the piezoelectric laminates generated forces in the range of 87% to 100%. However, when they were measured for preset load after endurance test, there were some exhibiting little change in preset load as compared with that at the initial stage, some exhibiting a lowering to nearly zero, etc. Thus, it is presumed that the decrease in preset load will be caused by slight shortening in the overall length of a piezoelectric laminate due to compatibility of the piezoelectric plates and the electrode plates of the piezoelectric laminate or due to domain inversion, or caused by sag of a coned disc spring itself and wear of peripheral components.

According to another test conducted by the present inventors, when the preset load decreased to lower than 0.15 kgf/mm$^2$ per unit area of each piezoelectric laminate, there occurred wobbling of the piezoelectric laminate due to vibrations and only 25% or less of the maximum capacity of the piezoelectric laminate could be exhibited. Large wobbling of the piezoelectric laminate resulted in damage of the piezoelectric laminate itself.

According to the construction of the present invention adopted in view of the above test results, a coned disc spring capable of affording a preset load sufficient for the piezoelectric laminate to fully exhibit its inherent performance, and a coil spring superior in durability, are used in combination, whereby the capacity of the piezoelectric laminate is exhibited to a maximum extent and the damage, etc. of the piezoelectric laminate is sure to be prevented from the time when a preset load is set initially until after use over a long period, that is, after endurance.

More specifically, as shown in FIG. 2, by using a coned disc spring and a coil spring in combination, the preset load per unit area acting on the piezoelectric elements becomes larger than line B even at the lowest, so the capacity of the piezoelectric element can be exhibited 100%. After endurance, even when the set load of the coned disc spring becomes zero under severe endurance conditions such as severe temperature and operating voltage conditions, the set load of the coil spring does not greatly change, so the set load per unit area is kept larger than line A in FIG. 2 and hence the capacity of the piezoelectric laminate can be exhibited 70% or more even at the lowest.

In the first embodiment, for applying a preset load to the piezoelectric laminate, there were used a coil spring as the first spring means having a relatively small spring constant and a coned disc spring as the second spring means having a relatively large spring constant. But in the present invention there may be used any springs if only the combination of springs used as the first and second spring means is a combination of a spring capable of being set relatively small in spring constant and a spring capable of being set relatively large in spring constant. For example, the spring constant of the spring means relatively small in spring constant is several kgf/mm to several 10 kgf/mm, while that of the spring means relatively large in spring constant is set at several 100 kgf/mm.

In this way, when an appropriate preset load is applied to the piezoelectric laminate 1, the piezoelectric laminate expands and contracts in the laminated direction according to voltages applied thereto through the lead wires 6 and 8, and the piston 4 is driven with such expansion and contraction.

Figure 3:
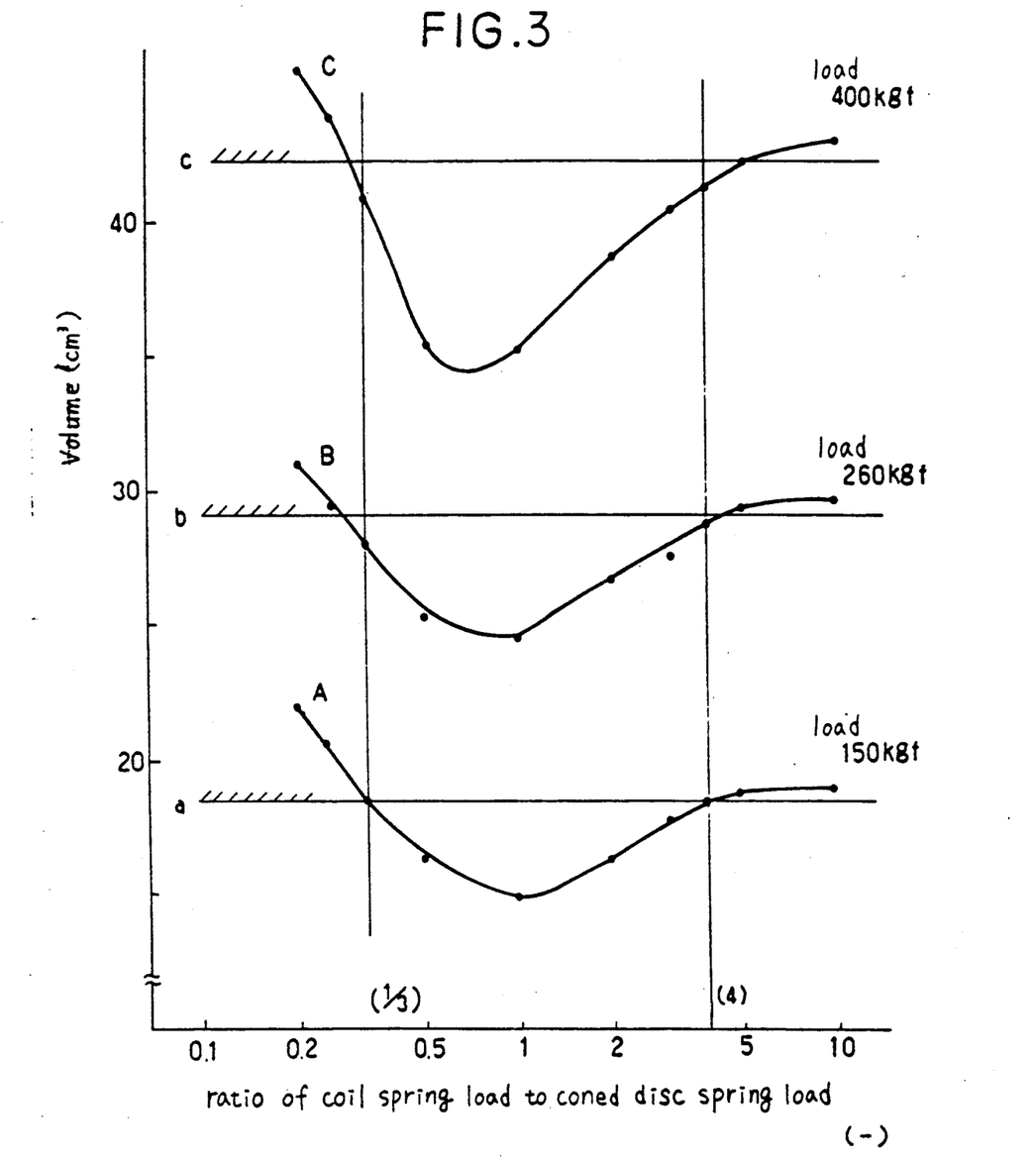
FIG. 3 is a diagram showing the relation between L values and volume.

FIG. 3 shows in terms of semi-logarithm the relation between the ratio (hereinafter referred to as "L") of a coil spring load to a coned disc spring load in each of piezoelectric laminates of different sizes and volume, which volume represents a total volume of the volume of each piezoelectric laminate and that of the entire volume of the springs. The marks A, B and C in the figure represent piezoelectric laminates of 12 mm, 15 mm and 18 mm, respectively, in diameter. The respective optimum preset loads were 150, 260 and 400 kgf. The straight lines a, b and c indicate volumes required when preset loads for the piezoelectric laminates are provided by the respective coil springs alone.

As shown in FIG. 3, even with change in size of the piezoelectric laminates, there can be set volumes smaller than those of the coil springs alone as long as the L value is in the range of $\frac{1}{8}$ to 4. It turned out that this effect was particularly outstanding in the range of 0.5 to 2 in terms of L value.

Figure 4:
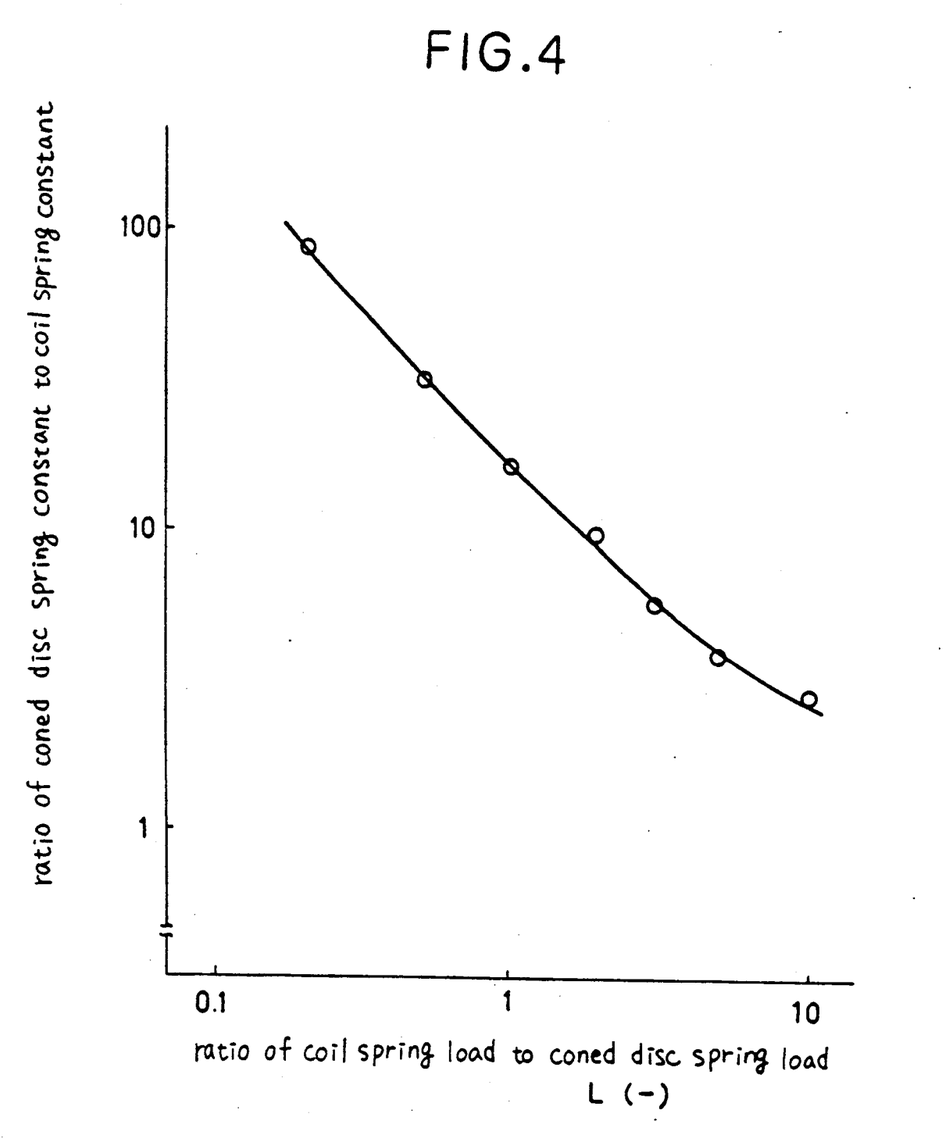
FIG. 4 is a diagram showing the relation between L and K values.

FIG. 4 shows in terms of logarithm the relation between L values and the ratio (hereinafter referred to as "K") of a coned disc spring constant to a coil spring constant.

From FIG. 4, K values are in the range of 4.0 to 50 for L values of $\frac{1}{8}$ to 4, and 6 to 30 for L values of 0.5 to 2. In other words, the present inventors found out that the reduction in size of the piezoelectric type actuator could be realized only when the K value is in the range of 4 to 50, preferably 6 to 30.

Figure 5:
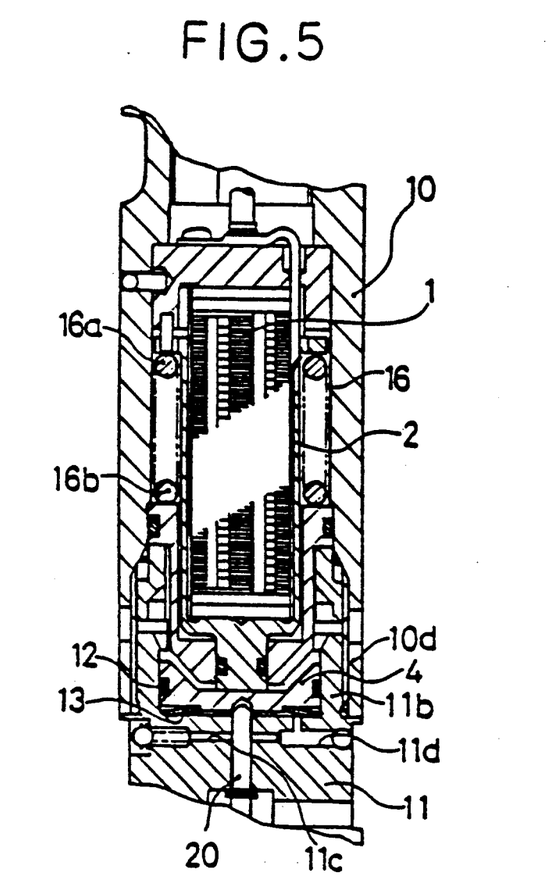
FIG. 5 is a schematic sectional view of a piezoelectric type actuator according to a second embodiment of the present invention.

FIG. 5 illustrates a second embodiment of the present invention, in which the piezoelectric laminate in the invention is applied to the actuator of an oil pressure change-over valve. In FIG. 5, the constituent portions which are substantially the same as in FIG. 1 are indicated by the same reference numerals.

According to the second embodiment, an oil passage 11c is formed in a second body 11, and a plunger 20 is driven with sliding motion of a piston 4 through a sealing oil introduced into a pressure oil chamber in which is received a coned disc spring.

Figure 6:
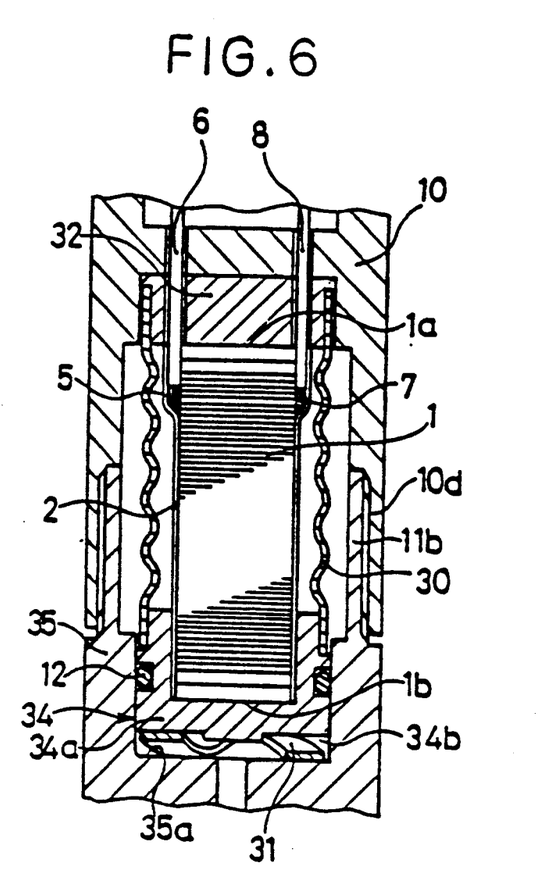
FIG. 6 is a schematic sectional view of a piezoelectric type actuator according to a third embodiment of the present invention.

FIG. 6 illustrates a third embodiment of the present invention, in which a cylindrical, metallic bellows 30 is used as a spring having a small spring constant, and a wave spring 31 is used as a spring having a large spring constant. One end 1a of a piezoelectric laminate 1 is in abutment with a disc-like cover 32, while an opposite end 1b is in abutment with a bottomed portion 34a of a piston 34. The cover 32 and the piston 34 are connected together through a metallic bellows 30. A tensile force of the metallic bellows 30 acts as a preset load. In the interior of the metallic bellows 30 is disposed the piezoelectric laminate 1. Any means may be adopted for connecting the metallic bellows 30 with the cover 32 and the piston 34. For example, there may be used fixing with screw or fixing by welding. A wave spring 31 is disposed between an end face 34b of the piston 34 and a cylinder bottom 35a of a second body 35, whereby an urging force is applied to the piezoelectric laminate 1 through the piston 34.

According to this third embodiment, a metallic bellows 30 is used as a spring having a small spring constant, while the wave spring 31 is used as a spring having a large spring constant. In initial setting of a preset load, the force generated by the piezoelectric laminate 1 is exhibited 100° by the action of the wave spring 31 relatively large in spring constant, while after endurance, a preset load not causing damage is ensured even at the lowest by the metallic bellows 30 to act on the piezoelectric laminate 1.

The third embodiment is characterized in that the metallic bellows 30 acts as a tension spring. It goes without saying that in the present invention there may be used other kinds of springs or other methods of using springs.

Figure 7:
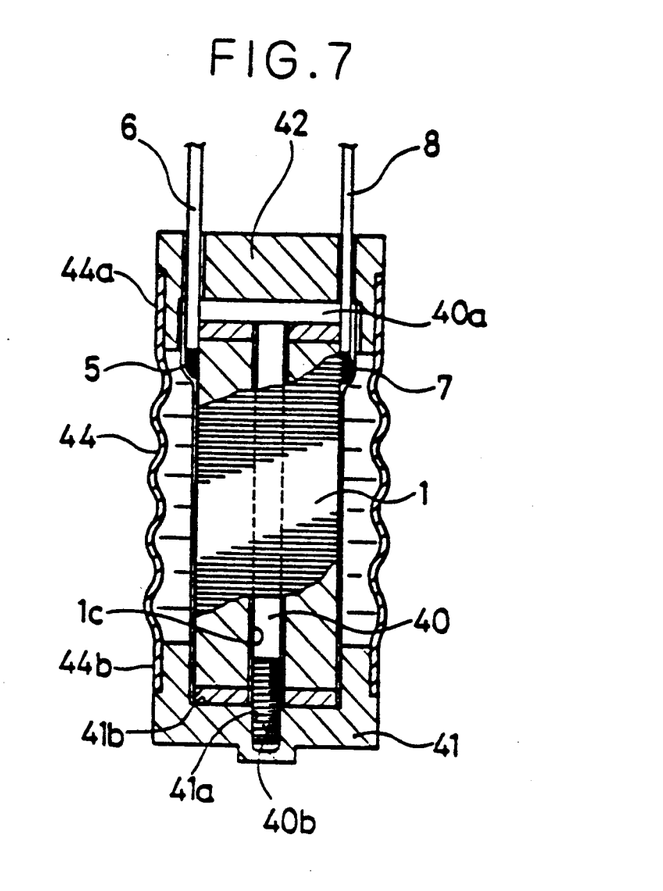
FIG. 7 is a schematic sectional view of a piezoelectric type actuator according to a fourth embodiment of the present invention.

FIG. 7 illustrates a fourth embodiment of the present invention, in which a bolt 40 is used as a second spring means having a large spring constant. The piezoelectric plates and electrode plates of a piezoelectric laminate 1 are annular, and into an inner hole 1c formed therethrough the bolt 40 is inserted. A tip end 40b of the bolt 40 is threadedly engaged with a bolt 41a of a piston 41, whereby a preset load is applied to the piezoelectric laminate 1 which is sandwiched in between a bolt head 40a of the bolt 40 and an inside bottom 41b of the piston 41.

One end 44a of a metallic bellows 44 having a relatively small spring constant is fixed to the outer periphery of a cover 42 which receives the bolt head 40a bellows is fixed to the outer periphery of the piston 41. The metallic bellows 44 generates a tensile force and the spring constant thereof is set in the range of several kgf/mm to several 10 kgf/mm.

According to the fourth embodiment, a relatively large preset load is imposed on the piezoelectric laminate 1 by tightening of the bolt 40, and a set load of a predetermined value or more is ensured by the metallic bellows 44 so that a sufficient set load is exerted on the piezoelectric laminate 1 even after use for many hours.

What is claimed is:

1. A piezoelectric type actuator comprising:
   a piezoelectric laminate comprising alternately superimposed piezoelectric plates as piezoelectric elements and metallic electrode plates;
   a first spring means for exerting a compressive force on said piezoelectric laminate and having a relatively small spring constant and relatively long effective stroke;
   a second spring means for exerting a compressive force on said piezoelectric laminate and having a relatively large spring constant and relatively short effective stroke;
   said first spring means and second spring means being positioned in parallel with each other, and positioned so that an expanding stroke of said first spring means is equal to an expanding stroke of said second spring means when a length of said piezoelectric laminate after deforming is less than a maximum expanding length of said second spring means, so that the compressive force caused by said second spring means is dominant, and the compressive force caused by said first spring means becomes dominant when the length of said piezoelectric laminate after deforming exceeds the maximum expanding length of said second spring means, 2. A piezoelectric type actuator according to claim 1, wherein the ratio of a spring constant of said second spring means to that of said first spring means is in the range of 4.0 to 50.

3. A piezoelectric type actuator according to claim 1, wherein said first spring means is constituted by at least one of a coil spring and a metallic bellows.

4. A piezoelectric type actuator according to claim 1, wherein said second spring means is constituted by at least one of a coned disc spring, a wave spring and a bolt.

5. A piezoelectric type actuator according to claim 1, wherein said first spring means is a coil spring and said second spring means is a coned disc spring.

6. A piezoelectric type actuator according to claim 5, wherein a ratio of the spring constant of said coned disc spring to that of said coil spring is in the range of 4.09 to 50.

7. A piezoelectric type actuator comprising:
   a piezoelectric laminate comprising alternately superimposed piezoelectric plates as piezoelectric elements and metallic electrode plates;
   a first spring means for exerting a compressive force on said piezoelectric laminate;
   a second spring means for exerting a compressive force on said piezoelectric laminate;
   said first spring means and second spring means being positioned in parallel with each other, and positioned so that an expanding stroke of said first spring means is equal to an expanding stroke of said second spring means when said piezoelectric laminate has a length which is less than a maximum expanding length of said second spring means, thereby a compressive force caused by said second spring means is dominant, and a compressive force caused by said first spring means becomes dominant when the deforming length of said piezoelectric laminate exceeds the maximum expanding length of said second spring means; and
   a ratio of a spring load of said first spring means to that of said second spring means being in the range of $\frac{1}{4}$ to $\frac{1}{4}$.

8. A piezoelectric actuator according to claim 7, wherein said first spring means is constituted by at least one of a coil spring and a metallic bellows.

9. A piezoelectric type actuator according to claim 7, wherein said second spring means is constituted by at least one of a coned disc spring, a wave spring and a bolt.

10. A piezoelectric type actuator according to claim 7, wherein said first spring means is a coil spring and said second spring means is a coned disc spring.

11. A piezoelectric type actuator comprising:

a piston comprising a piezoelectric laminate and a holder member which receives said piezoelectric laminate slidably therein, said piezoelectric laminate comprising alternately superimposed piezoelectric plates as piezoelectric elements and metallic electrode plates, said holder member having a bottomed portion formed at one end thereof and also having a flange formed at an opening portion of the other end thereof;

a first body which receives at least said flange-side end face of said piston slidably therein;

a second body which receives said bottomed portion-side end face of said piston slidably therein, said second body having a shoulder portion opposed to said flange of said holder member;

a first spring means for exerting a compressive force on said piezoelectric laminate, said first spring means being interposed between said shoulder portion of said second body and said flange of said holder member and having a relatively small spring constant; and a second spring means for exerting a compressive force on said piezoelectric laminate, said second spring being interposed between said second body and said bottomed portion of said holder member and having a relatively large spring constant.

12. A piezoelectric type actuator according to claim 11, wherein the ratio of the spring constant of said second spring means to that of said first spring means is in the range of 4.0 to 50.

13. A piezoelectric type actuator according to claim 8, wherein said first spring means includes a coil spring and said second spring means includes a coned disc spring.

14. A piezoelectric type actuator according to claim 13, wherein the ratio of the spring constant of said coned disc spring to that of said coil spring is in the range of 4.0 to 50.

* * * * *